(12) United States Patent
Takahashi et al.

(10) Patent No.: US 8,193,456 B2
(45) Date of Patent: Jun. 5, 2012

(54) ELECTRICAL INSPECTION SUBSTRATE UNIT AND MANUFACTURING METHOD THEREFORE

(75) Inventors: Hiroyuki Takahashi, Kasugai (JP); Chie Honda, Kurashiki (JP); Tatsuya Kato, Aichi (JP); Tomohide Yamada, Komaki (JP); Shigeru Taga, Aichi (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 409 days.

(21) Appl. No.: 12/493,732

(22) Filed: Jun. 29, 2009

(65) Prior Publication Data

US 2009/0321114 A1 Dec. 31, 2009

(30) Foreign Application Priority Data

Jun. 30, 2008 (JP) .................. 2008-170737
Apr. 20, 2009 (JP) .................. 2009-102147

(51) Int. Cl.
*H05K 1/00* (2006.01)
*H05K 3/02* (2006.01)
(52) U.S. Cl. ........................... 174/258; 29/846
(58) Field of Classification Search .............. 174/258, 174/261, 255–257, 259; 29/846–853
See application file for complete search history.

(56) References Cited

U.S. PATENT DOCUMENTS

| 4,939,021 A | | 7/1990 | Aoki et al. | |
|---|---|---|---|---|
| 5,079,194 A | * | 1/1992 | Jean et al. | ............ 501/17 |
| 5,085,720 A | | 2/1992 | Mikeska et al. | |
| 6,118,671 A | * | 9/2000 | Tanei et al. | ........... 361/795 |
| 2001/0054481 A1 | * | 12/2001 | Harada et al. | ........... 156/289 |

FOREIGN PATENT DOCUMENTS

| JP | 8-018232 | 1/1996 |
|---|---|---|
| JP | 9-048660 | 2/1997 |
| JP | 2006-232645 | 9/2006 |
| JP | 2006-284541 | 10/2006 |

\* cited by examiner

*Primary Examiner* — Jeremy Norris
(74) *Attorney, Agent, or Firm* — Stites & Harbison PLLC; Jeffrey A. Haeberlin

(57) ABSTRACT

An electrical testing substrate unit includes a multi-layer ceramic substrate formed of mullite and a borosilicate glass as predominant ceramic components. In the multi-layer ceramic substrate, the borosilicate glass contains an alkali metal oxide in an amount of 0.5 to 1.5 mass %. The multi-layer ceramic substrate has a mean coefficient of linear thermal expansion having a value of 3.0 to 4.0 ppm/° C. between −50° C. and 150° C. A thermal expansion coefficient, $\alpha 1$, of the multi-layer ceramic substrate as determined at a particular temperature and a thermal expansion coefficient, $\alpha 2$, of a to-be-tested silicon wafer as determined at the same temperature silicon satisfy a relation: 0 ppm/° C.$<\alpha 1 - \alpha 2 \leq 2.5$ ppm/° C. through the temperature range of −50° C. to 150° C. Electrodes are formed on a surface of the multi-layer ceramic substrate.

10 Claims, 8 Drawing Sheets

FIG. 10
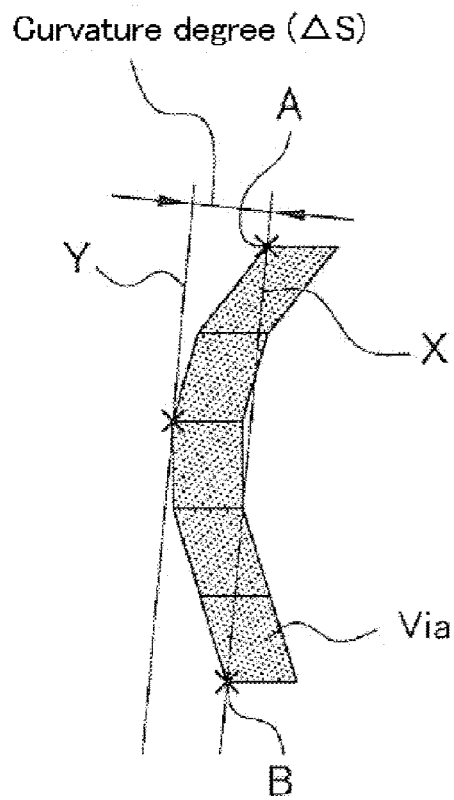
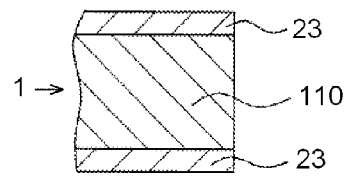
FIG. 11(a)
Pressure applied
0.2MPa (0.1~0.5MPa)
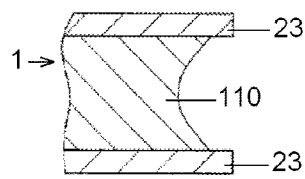
FIG. 11(b)
Low pressure applied
0.08MPa
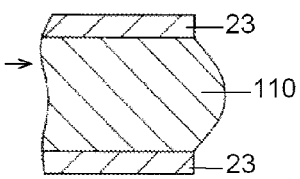
FIG. 11(c)
High pressure applied
0.55MPa

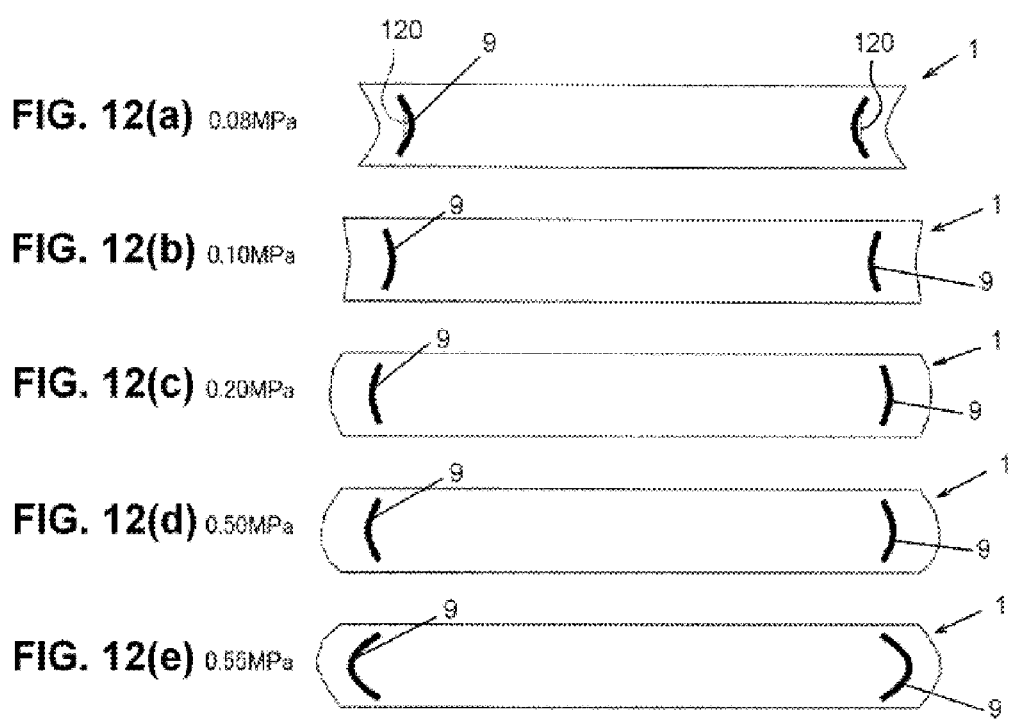
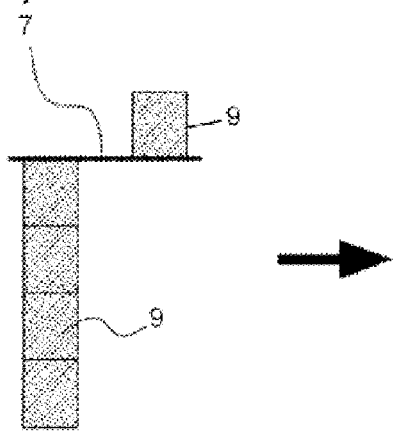
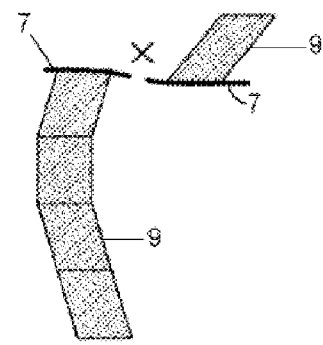

ELECTRICAL INSPECTION SUBSTRATE UNIT AND MANUFACTURING METHOD THEREFORE

CROSS-REFERENCE TO RELATED APPLICATIONS

This application is based on and claims priority to Japanese patent Application No. 2008-170737 filed Jun. 30, 2008 and Japanese patent Application No. 2009-102147 filed Apr. 20, 2009, the above applications incorporated herein by reference in their entirety.

BACKGROUND OF THE INVENTION

1. Field of the Invention

The present invention relates to an electrical inspection substrate unit including a multi-layer ceramic substrate which realizes highly accurate mounting, on a surface layer thereof, of connecting terminals for electrical inspection of a silicon wafer, and which can expand or shrink in a manner similar to that of a silicon wafer having a circuit thereon, even in the case where inspection is conducted over a wide temperature range (−50° C. to 150° C.).

2. Description of Related Art

In recent years, in IC chip inspections, the inspections performed on a silicon wafer unit have been required frequently. Particularly, at present, in association with development of large silicon wafers, inspections must be taken for silicon wafers having a size of φ 300 mm (12 inches).

For electrical inspections of such a silicon wafer, a jig used for inspection must be provided with connecting terminals which come into contact with IC chips. Since such connecting terminals repeatedly come into contact with IC chips, the terminals are required to have high strength.

Recently, in electrical inspection of a silicon wafer, a silicon wafer having passed electrical inspection has been required to be certified as a known good die (KGD). In order for a silicon wafer to be certified as a KGD, the wafer must pass a burn-in test (screening inspection under thermal and electrical loading).

However, in the case where a conventional jig for electrical inspection of a silicon wafer (wafer-inspection jig/probe card) is used for inspection of a silicon wafer, when electrical inspection is carried out at different temperatures, due to a considerable difference in thermal expansion coefficient between the wafer-inspection jig and the silicon wafer, mismatch in size occurs between the jig and the wafer through thermal expansion at the temperatures, and thus connecting terminals of the jig fail to come into contact with pads on the wafer.

Therefore, it is important that the thermal expansion coefficient of such a wafer-inspection jig be matched to some extent with that of a silicon wafer.

Meanwhile, such a wafer-inspection jig is required to include an electrical inspection substrate unit formed of a ceramic substrate, from the viewpoint of securing adhesion strength (with respect to repeated contact) of connecting terminals formed on the electrical inspection substrate unit. However, due to variation in an amount of shrinkage during firing, a typical method for manufacturing such a ceramic substrate encounters difficulty in attaining a dimensional accuracy required for connection of connecting terminals to pads on a silicon wafer.

A constrained sintering process is a technique for manufacturing a ceramic substrate required to exhibit high dimensional accuracy. In the constrained sintering process, top and bottom surfaces of a green sheet are provided with ceramic sheets (restraint sheets) which do not sinter at a temperature at which the green sheet is fired, and shrinkage of the green sheet during firing in an X-Y direction (plane direction) is suppressed by virtue of the presence of the ceramic sheets (restraint sheets), whereby high dimensional accuracy is attained.

In view of the foregoing, hitherto, attempts have been made to attain a ceramic composition of low thermal expansion (see: Japanese Patent Application Laid-Open (kokai) No. S63-107095; Japanese Patent Application Laid-Open (kokai) No. 2006-232645; and Japanese Patent Application Laid-Open (kokai) No. 2006-284541), and a low-temperature-firable ceramic material exhibiting high dimensional accuracy (see: Japanese Patent No. 2617643).

BRIEF SUMMARY OF THE INVENTION

Despite the aforementioned conventional partial attempts, no attempts have been made to develop a low-temperature-firable ceramic composition which exhibits low thermal expansion and which is suitable for use in a constrained sintering process required for attaining high dimensional accuracy, or a multi-layer ceramic substrate which is formed from the ceramic composition and which is employed in an electrical inspection substrate unit.

In order to solve the aforementioned problems, an object of the present invention is to provide an electrical inspection substrate unit which has connecting terminals thereon, which exhibits a dimensional accuracy sufficient for connection of the terminals to, for example, pads on a silicon wafer, and which prevents poor contact between the terminals and the pads on the silicon wafer even in the case of, for example, a inspection performed over a wide temperature range. Another object of the present invention is to provide a method for manufacturing the electrical inspection substrate unit.

According to one aspect of the present invention, an electrical inspection substrate unit includes a multi-layer ceramic substrate, and electrodes formed on a surface of the multi-layer ceramic substrate. The multi-layer ceramic substrate has a mean coefficient of linear thermal expansion having a value of 3.0 to 4.0 ppm/° C. between −50° C. and 150° C. A thermal expansion coefficient, $\alpha 1$, of the multi-layer ceramic substrate as determined at a particular temperature (instantaneous coefficient of linear thermal expansion) and a thermal expansion coefficient, $\alpha 2$, of a to-be-inspected silicon wafer as determined at the same temperature (instantaneous coefficient of linear thermal expansion) satisfy the relation: $0 \text{ ppm}/° C. < \alpha 1 - \alpha 2 \leqq 2.5 \text{ ppm}/° C.$ through the temperature range of −50° C. to 150° C.

Generally, electrical inspection of a silicon wafer is carried out within a temperature range of −50° C. to 150° C. In this temperature range, preferably, the difference in thermal expansion coefficient between the silicon wafer and an electrical inspection substrate unit of a jig for electrical inspection of the wafer (i.e., a wafer-inspection jig) is small.

Particularly in the case of a burn-in test, only the silicon wafer is heated, and the temperature of the wafer-inspection jig is heated up by heat radiated from the wafer. That is, the temperature of the silicon wafer is necessarily higher than that of the wafer-inspection jig. Thus, when the thermal expansion coefficient of the silicon wafer is equal to that of the electrical inspection substrate unit of the wafer-inspection jig, the shrinkage or expansion behavior of the silicon wafer does not match that of the wafer-inspection jig. Therefore, the electrical inspection substrate unit employed in the wafer-inspection jig must have a thermal expansion coefficient which is higher than that of the silicon wafer and which is not higher than a predetermined upper limit level.

Specifically, at −50° C. (i.e., the lowest temperature), the thermal expansion coefficient of the multi-layer ceramic substrate forming the electrical inspection substrate unit is determined so as to satisfy the following relation: 0 ppm/° C.<α1−α2≦1.5 ppm/° C., whereas at 150° C. (i.e., the highest temperature), the thermal expansion coefficient of the multi-layer ceramic substrate is determined so as to satisfy the following relation: 0.5 ppm/° C.≦α1−α2≦2.5 ppm/° C. This is because, particularly when (α1−α2) is greater than 2.5 ppm/° C. at 150° C., although there is a difference in temperature between the silicon wafer and the wafer-inspection jig, mismatch in thermal expansion behavior occurs between the silicon wafer and the wafer-inspection jig, and the size of the wafer-inspection jig deviates from such a size that connecting terminals of the jig can be applied to pads of the silicon wafer. For reasons similar to the case of 150° C., at −50° C., the thermal expansion coefficient of the multi-layer ceramic substrate is determined so as to satisfy the above-described relation.

FIG. 1 is a graph showing a range R of an exemplary embodiment of the present invention. The range R corresponds to a gray region defined by coordinates A (−50, 0), E (−50, 2.5), C (150, 2.5), and F (150, 0.5) (wherein the x-coordinate represents temperature [° C.], and the y-coordinate represents difference in thermal expansion coefficient [α1−α2]). A preferable range Rp of the exemplary embodiment of the present invention is a hatched region (see FIG. 1) defined by coordinates A (−50, 0), B (−50, 1.5), C (150, 2.5), and D (150, 0.5). In FIG. 1, "invention product" corresponds to an exemplary product falling within the range R of the exemplary embodiment of the present invention, and "conventional product" corresponds to an exemplary product falling outside the range R of the exemplary embodiment of the present invention. As used herein, the expression "thermal expansion coefficient as determined at a particular temperature" refers to the gradient, at a particular temperature, of the rate of change in size with change in temperature; i.e., the calculated gradient of the tangent at a particular temperature (instantaneous coefficient of linear thermal expansion) (see FIG. 2). In FIG. 2, "test piece" corresponds to an electrical inspection substrate unit (20 mm (length)×4 mm (width)×3 mm (thickness)) or a portion of a silicon wafer rod (20 mm (length)×4.5 mm (width)×4.5 mm (thickness)).

Thus, when the electrical inspection substrate unit of the present invention is employed in a jig for electrical inspection of a silicon wafer, satisfactory dimensional accuracy is achieved from the viewpoint of electrical connection between the substrate unit and pads of the silicon wafer. Even when the temperature of the silicon wafer is changed upon, for example, inspection, the pads of the silicon wafer can be connected to connecting terminals formed on the electrical inspection substrate unit without causing any problem in terms of electrical connection.

The electrical inspection substrate unit of the exemplary embodiment of the present invention realizes highly accurate mounting, on a surface layer of the multi-layer ceramic substrate, of connecting terminals for electrical inspection of a silicon wafer. In addition, the electrical inspection substrate unit can expand or shrink in a manner similar to that of a silicon wafer having a circuit thereon, even in the case of inspection over a wide temperature range (e.g., in the case of a burn-in test). Therefore, the electrical inspection substrate unit of the exemplary embodiment of the present invention is very suitable for use in a jig for electrical inspection of a silicon wafer.

In accordance with one implementation, the multi-layer ceramic substrate (which forms the electrical inspection substrate unit) is formed of ceramic layers containing mullite ($3Al_2O_3 \cdot 2SiO_2$) and a borosilicate glass, with the borosilicate glass containing an alkali metal oxide (e.g., $Na_2O$ or $K_2O$) in an amount of 0.5 mass % to 1.5 mass %.

When the multi-layer ceramic substrate contains mullite (i.e., a low-thermal-expansion material) and a low-temperature-firable borosilicate glass, the electrical inspection substrate unit exhibits low thermal expansion and can be fired at a low temperature (e.g., 800° C. to 950° C.).

When the amount of the alkali metal oxide contained in the borosilicate glass is 0.5 mass % or more, an increase in viscosity of the glass can be suppressed, and, for example, inhibition of densification or elevation of sintering temperature, which would otherwise occur due to reduction in fluidity of the glass upon firing under application of pressure (hereinafter may be referred to simply as "pressure firing"), can be prevented. When the amount of the alkali metal oxide contained in the borosilicate glass is 1.5 mass % or less, a short circuit, which would otherwise occur due to migration of an inner conductor (e.g., Ag), can be prevented.

Since mullite (i.e., a low-thermal-expansion material) is incorporated as a filler (i.e., aggregate dispersed in a matrix), the multi-layer ceramic substrate exhibits a mean coefficient of linear thermal expansion having a value of 3.0 to 4.0 ppm/° C. between −50° C. and 150° C. Also, the thermal expansion coefficient α1 of the substrate as determined at a particular temperature and the thermal expansion coefficient α2 of the to-be-tested silicon wafer as determined at the same temperature satisfy the relation: 0 ppm/° C.<α1−α2≦2.5 ppm/° C. though the temperature range of −50° C. to 150° C.

The total amount of mullite and the borosilicate glass contained in the ceramic layers may be 95 mass % or more. However, preferably, the ceramic layers are formed from only mullite and the borosilicate glass. The ceramic layers contain mullite as a main crystal phase.

The borosilicate glass may be, for example, $SiO_2$—$Al_2O_3$—$B_2O_3$—CaO, and the amount thereof (with respect to the ceramic material) may be 55 vol. % to 80 vol. %.

The amount of the alkali metal oxide (e.g., $Na_2O$ or $K_2O$) contained in the borosilicate glass may be, for example, 0.5 mass %.

The borosilicate glass may further contain $Li_2O$, which is an alkali metal oxide, in an amount of 0.1 mass % or less. When the amount of $Li_2O$ contained in the borosilicate glass is 0.1 mass % or less, migration of Ag (i.e., a conductive component) is less likely to occur, and, therefore, electrical reliability is enhanced.

Still further, the amount of mullite may be 20 vol. % to 45 vol. % (preferably 35 vol. % to 45 vol. %) on the basis of the entirety of the ceramic substrate. When the amount of mullite is 20 vol. % or more, the multi-layer ceramic substrate exhibits enhanced mechanical strength. When the amount of mullite is 45 vol. % or less, the multi-layer ceramic substrate contains a glass component in a sufficient amount. Therefore, firing at a low temperature (1,000° C. or lower) is readily carried out, and, for example, co-firing with an Ag-containing low-resistance conductor can be readily carried out.

In the case where the multi-layer ceramic substrate exhibits a three-point flexural strength of 200 MPa or more as determined according to JIS R1601, since connecting terminals of a jig for electrical inspection of a silicon wafer exhibit sufficient adhesion strength, and the electrical inspection substrate unit itself exhibits sufficient mechanical strength, even when the wafer-inspection jig is repeatedly used for inspection, high reliability can be secured, which is preferred.

Even further still, an inner conductor of the multi-layer ceramic substrate may be formed of any one of Ag, an Ag/Pt alloy, and an Ag/Pd alloy. When such a conductor is employed, co-firing at a low temperature (e.g., 800° C. to 950° C.) can be readily carried out.

According to another aspect of the invention, a method for manufacturing an electrical inspection substrate unit comprises: forming a predetermined number of first green sheets from a low-temperature-firable ceramic material containing, as main or principal components, mullite and a borosilicate glass; forming a conductor on each of the first green sheets; stacking the first green sheets to form a multi-layer green sheet unit having a top surface and a bottom surface; stacking a second green sheet on each of the top surface and the bottom surface of the multi-layer green sheet unit to form a multi-layer green sheet composite, the second green sheets comprising a material which does not sinter at a temperature at which the first green sheets are fired; firing the multi-layer green sheet composite under application of pressure; removing unsintered layers formed of the second green sheets from the thus-fired multi-layer green sheet composite, to thereby form a multi-layer ceramic substrate; and forming a conductor on a surface of the multi-layer ceramic substrate to form an electrical inspection substrate unit.

The electrical inspection substrate unit employed for a jig for electrical inspection of a silicon wafer (wafer-inspection jig) is preferably formed of a thick multi-layer ceramic substrate having a thickness of 3 mm to 7 mm, from the viewpoints of, for example, electrical and mechanical characteristics. This is because, when the thickness is smaller than 3 mm, the multi-layer ceramic substrate exhibits insufficient strength, whereas when the thickness is greater than 7 mm, the multi-layer ceramic substrate requires a larger-than-necessary space for mounting the substrate on an IC chip inspection jig, and difficulty is encountered in attaching the jig to a inspection apparatus. In many cases, such a substrate has a structure in which conductors (interlayer connection conductors) having a length equal to or greater than ½ the thickness of the substrate are continuously provided.

When such a substrate is manufactured through a constrained sintering process without an application of pressure, shrinkage of the ceramic material in an X-Y direction cannot be suppressed by means of only a restraint layer. In addition, since the substrate has a large thickness, and accordingly interlayer connection conductors (e.g., Ag-containing conductors) have a large length, the difference in shrinkage between the ceramic material and the interlayer connection conductors greatly affects the substrate, and thus defects (e.g., voids or cracks) are generated between the ceramic material and the interlayer connection conductors.

Therefore, constrained sintering under the application of pressure (i.e., a "pressure assisted constrained sintering process") is required for manufacturing, at high dimensional accuracy, such a multi-layer ceramic substrate having a large thickness and including therein interlayer connection conductors extending in a thickness direction.

Thus, according to the present invention, there can be suitably manufactured, through the aforementioned pressure assisted constrained sintering technique, an electrical inspection substrate unit having a thickness of, for example, 3 mm or more with generation of voids or cracks being suppressed, and with deformation of the substrate unit being suppressed.

When the thus-manufactured electrical inspection substrate unit is employed in a silicon wafer-inspection jig, satisfactory dimensional accuracy is achieved from the viewpoint of electrical connection between the substrate unit and pads of the silicon wafer. In addition, even when the temperature of the silicon wafer is changed upon, for example, inspection, the pads of the silicon wafer can be connected to connecting terminals formed on the electrical inspection substrate unit without causing any problem in terms of electrical connection.

The multi-layer ceramic substrate employed in the present invention is preferably formed from a material described above. Specifically, the first green sheets may be formed from a ceramic material described above, whereas the second green sheets may be formed from a material which does not sinter at a temperature at which the first green sheets are sintered (e.g., alumina, mullite, or magnesia).

The borosilicate glass employed is preferably a glass which does not crystallize at 800° C. to 1,000° C. This is because, when a glass which crystallizes during pressure firing is employed, change in fluidity of the glass occurs locally at a crystallized portion, and flow of the glass by means of pressure applied during pressure firing is inhibited, which may generate internal stress, resulting in lowered reliability of substrate strength.

Low-temperature firing is carried out at, for example, 800° C. to 950° C. In the step of "firing the multi-layer green sheet composite under application of pressure," firing is carried out at the aforementioned temperature. In this step, only the first green sheets are fired, and the second green sheets (i.e., restraint sheets) do not sinter.

The aforementioned conductor may be, for example, Ag, Ag/Pd, or Ag/Pt.

In accordance with an implementation, the pressure applied during firing may be 0.1 to 0.5 MPa. This pressure range is a preferred pressure range within which deformation of a ceramic material is suppressed (see FIG. 11(a) and FIGS. 12(b) to 12(d)).

In contrast, when the pressure applied during firing of a thick ceramic substrate (e.g., 3 mm or more) is lower than 0.1 MPa, shrinkage in an X-Y direction fails to be suppressed in the vicinity of the center (in a thickness direction) of the substrate, and dimensional variation or defects (e.g., cracks) may occur after firing. In addition, apparent difference in shrinkage behavior may be observed between the ceramic substrate and interlayer connection conductors (vias) having a length (in a thickness direction) equal to or greater than ½ the thickness of the substrate, and voids or cracks may be generated (see FIG. 11(b)). Furthermore, the vias may be considerably curved inward, and voids may be generated outside of the vias (see FIG. 12(a)).

When the applied pressure exceeds 0.5 MPa, the pressure is greater than the shrinkage force generated by the softening of the glass during firing, and the substrate may be considerably deformed (see FIG. 11(c)). In addition, the vias may be considerably curved outward, and disconnection of wiring may occur (see FIG. 12(e) and FIG. 13).

BRIEF DESCRIPTION OF THE DRAWINGS

FIG. 10 is a schematic view of an exposed via illustrating a via curvature degree.

FIG. 11(a) through FIG. 11(c) are partial side sectional views of an exemplary electrical inspection substrate unit formed under application of different pressures.

FIG. 12(a) through FIG. 12(e) are side schematic views of an exemplary electrical inspection substrate unit and corresponding vias formed under application of different pressures.

FIG. 13(a) and FIG. 13(b) are side schematic views of connecting vias and an inner wiring layer showing disconnection of the wiring layer due to curvature of the vias.

DETAILED DESCRIPTION OF EXEMPLARY EMBODIMENTS OF THE INVENTION

An embodiment of the present invention will next be described with reference to the drawings.

a) An electrical inspection substrate unit according to this embodiment will now be described with reference to FIGS. 3 and 4.

Figure 1:
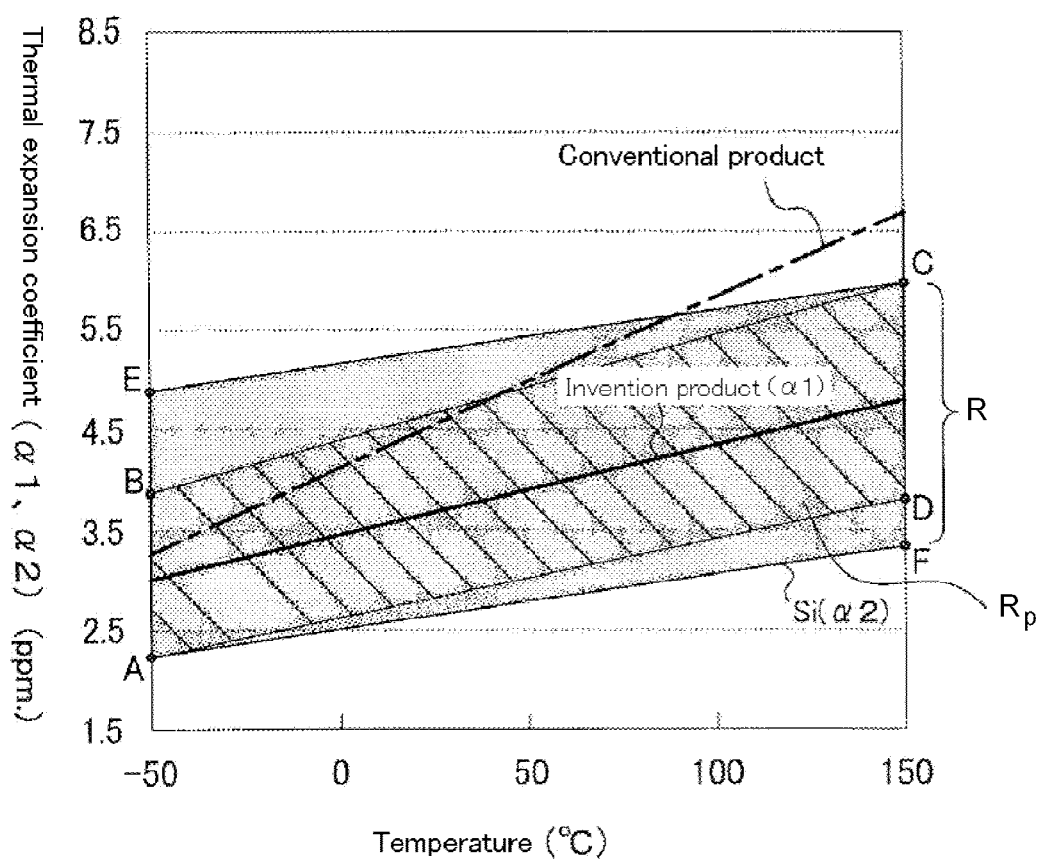
FIG. 1 is a graph showing a range of an exemplary embodiment of the present invention.
Figure 2:
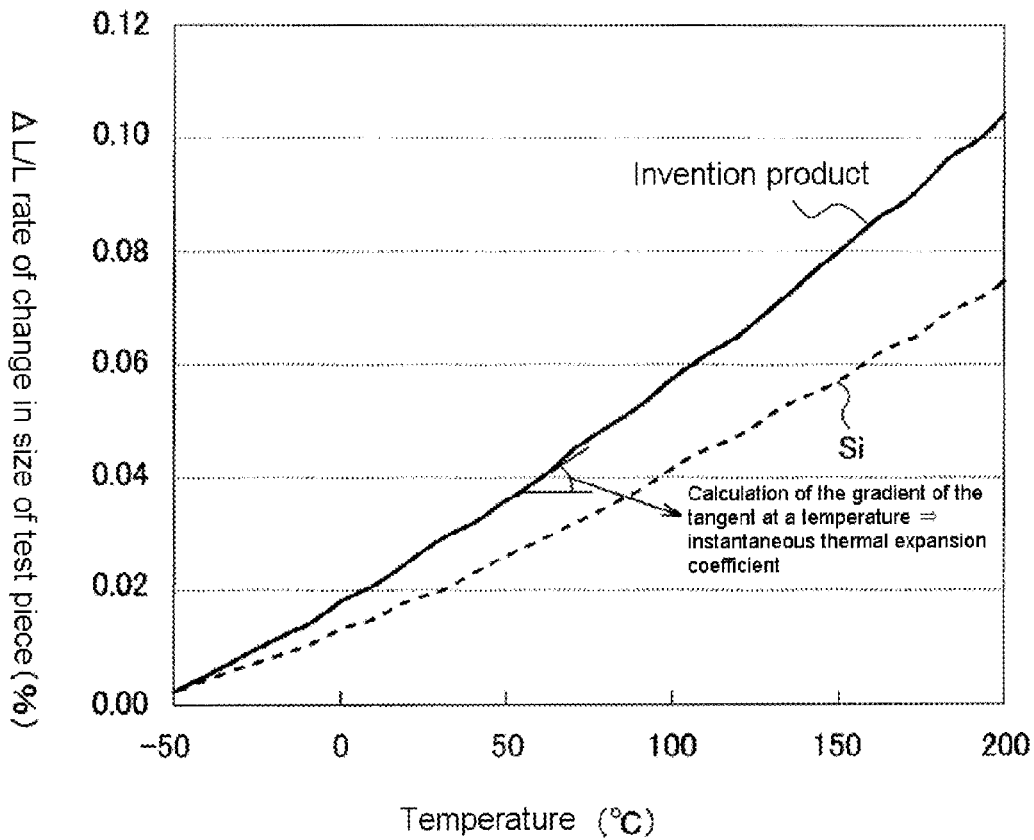
FIG. 2 is a graph showing a rate of change in size with temperature of a test piece of an exemplary embodiment of the present invention.
Figure 3:
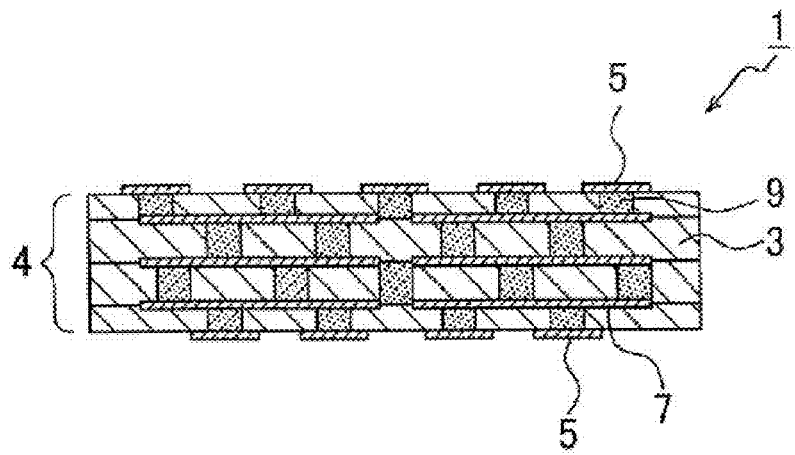
FIG. 3 is a schematic cross-sectional view of an electrical inspection substrate unit according to an exemplary embodiment of the present invention.

As shown in FIG. 3, an electrical inspection substrate unit 1 according to this embodiment includes a multi-layer ceramic substrate 4 (e.g., rectangular parallelepiped sintered substrate having a thickness of 5 mm, a length of 300 mm, and a width of 300 mm) formed by stacking a plurality of glass ceramic layers 3 in a thickness direction, and electrodes 5 formed on surfaces of the multi-layer ceramic substrate 4.

The glass ceramic layers 3 are formed of a glass ceramic material obtained through firing, at a low temperature (e.g., about 800° C. to about 1,050° C.), of a mixture of, for example, a glass component and a ceramic component.

Specifically, each of the glass ceramic layers 3 is formed of a glass ceramic material containing, as main components, mullite and a borosilicate glass, and the borosilicate glass contains an alkali metal oxide(s) ($Na_2O$ and/or $K_2O$) in an amount of 0.5 to 1.5 mass %.

The glass ceramic material contains $Li_2O$ (i.e., an alkali metal oxide) in an amount of 0.1 mass % or less, and contains mullite as a filler in an amount of 20 to 45 vol. %.

The multi-layer ceramic substrate 4 exhibits a mean coefficient of linear thermal expansion having a value of 3.0 to 4.0 ppm/° C. between −50° C. and 150° C. Additionally, a thermal expansion coefficient, $\alpha 1$, of the substrate as determined at a temperature and a thermal expansion coefficient, $\alpha 2$, of a to-be-inspected silicon wafer as determined at the same temperature satisfy the following relation: 0 ppm/° C.$<\alpha 1 - \alpha 2 \leq 2.5$ ppm/° C. through the temperature range of −50° C. to 150° C.

The electrodes 5, which are formed on the top and bottom surfaces of the multi-layer ceramic substrate 4, have a structure in which a Ti layer, a Cu layer, a Ni layer, and an Au layer are sequentially stacked. Inner wiring layers 7 are formed in the interior of the multi-layer ceramic substrate 4 (specifically, at boundaries between adjacent glass ceramic layers 3). Furthermore, interlayer connection conductors (vias) 9 extending in a thickness direction of the substrate are formed so as to electrically connect, via the inner wiring layers 7, the electrodes 5 on the top surface of the multi-layer ceramic substrate 4 and the electrodes 5 on the bottom surface of the substrate 4.

Figure 4:
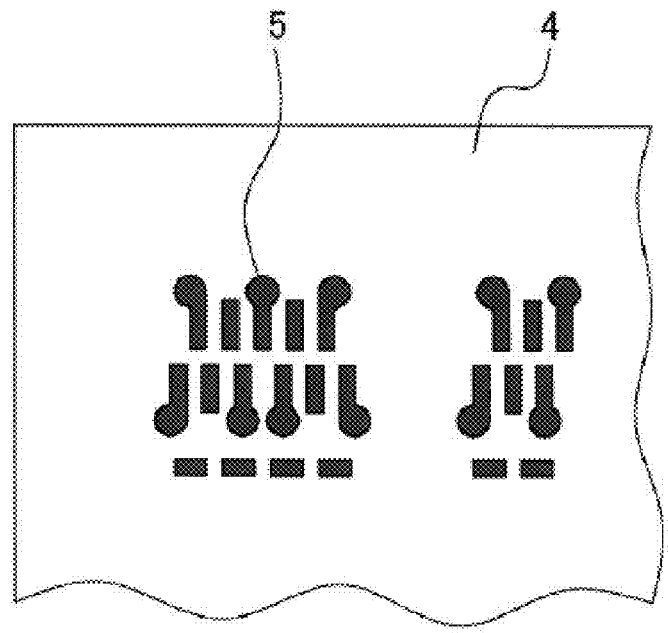
FIG. 4 is a plan view of a portion of a surface of the electrical inspection substrate unit of FIG. 3.

Thus, as shown in FIG. 4, numerous electrodes 5 are exposed on the surfaces of the multi-layer ceramic substrate 4.

The conductor forming the electrodes 5 may be Ti, Cr, Mo, Cu, Ni, Au, or a combination thereof. The conductor forming the inner wiring layers 7 or the vias 9 may be a conductor which can be co-fired with the glass ceramic material at low temperature (e.g., Ag, an Ag/Pt alloy, or an Ag/Pd alloy).

Figure 5:
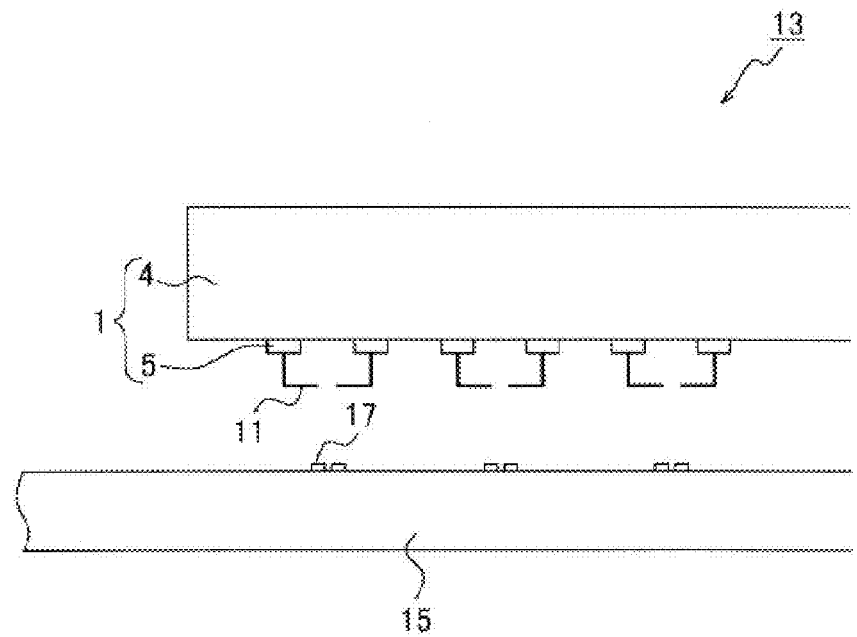
FIG. 5 is a side view of an IC chip inspection jig and a silicon wafer.

As shown in FIG. 5, the electrodes 5 on the multi-layer ceramic substrate 4 having the aforementioned configuration are connected to electrically conductive probes (connecting terminals) 11, to thereby form an IC chip inspection jig (silicon wafer electrical inspection jig) 13.

The IC chip inspection jig 13 corresponds to, for example, a silicon (Si) wafer 15 having a size of φ 300 mm (12 inches). Numerous IC chips of the silicon wafer 15 can be inspected at one time by bringing the probes 11 into contact with terminals 17 of the IC chips before the wafer is cut into IC chips.

b) A method for manufacturing the electrical inspection substrate unit 1 according to this embodiment will now be described in detail with reference to FIGS. 6 and 7.

(1) Firstly, there are provided ceramic raw material powders; i.e., borosilicate glass powder containing $SiO_2$, $Al_2O_3$, and $B_2O_3$ as main components (mean particle size: 3 μm, specific surface area: 2.0 $m^2/g$) and mullite powder (mean particle size: 2 μm, specific surface area: 3.0 $m^2/g$).

Furthermore, an acrylic binder and DOP (dioctyl phthalate) is provided as a binder component and a plasticizer component employed during sheet molding.

The borosilicate glass powder and the mullite powder are added (ratio by mass=50:50, total amount: 1,000 g) to an alumina pot together with an acrylic resin (120 g). Furthermore, a solvent (MEK: methyl ethyl ketone) and a plasticizer (DOP) are added to the pot in amounts required for attaining appropriate slurry viscosity and sheet strength, followed by mixing for three hours, to thereby yield a ceramic slurry.

Figure 6A:
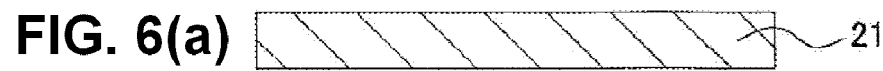
FIG. 6(a) through FIG. 6(f) show an exemplary electrical inspection substrate unit at various steps in an exemplary method for manufacturing the electrical inspection substrate unit.

As shown in FIG. 6(a), first green sheets 21 (for the glass ceramic layers 3), each having a thickness of 0.15 mm, are formed from the thus-obtained ceramic slurry through a doctor blade method.

(2) Separately from the step of forming the first green sheets 21, alumina powder (mean particle size: 2 μm, specific surface area: 1 $m^2/g$) serving as a ceramic raw material is provided for forming restraint sheets (second green sheets) 23.

Furthermore, an acrylic binder, DOP, and MEK are provided as a binder component, a plasticizer component, and a solvent, respectively, which are employed during sheet molding.

Similar to the case of the first green sheets 21, the alumina powder (1,000 g) is added to an alumina pot together with an acrylic resin (120 g). Furthermore, a solvent (MEK) and a plasticizer (DOP) are added to the pot in amounts required for attaining appropriate slurry viscosity and sheet strength, followed by mixing for three hours, to thereby yield a slurry.

Figure 6B:
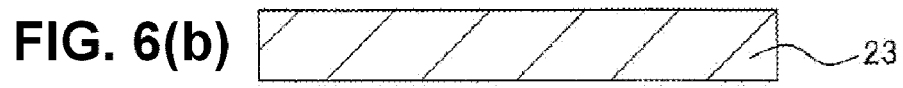

Shown in FIG. 6(b), second green sheets 23, each having a thickness of 0.30 mm, are formed from the thus-obtained slurry through the doctor blade method.

Figure 6C:
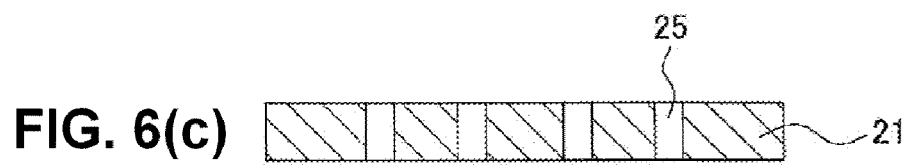

(3) Subsequently, as shown in FIG. 6(c), via holes 25 having a diameter of 0.12 mm are formed in each of the first green sheets 21 by means of a punch.

Figure 6D:
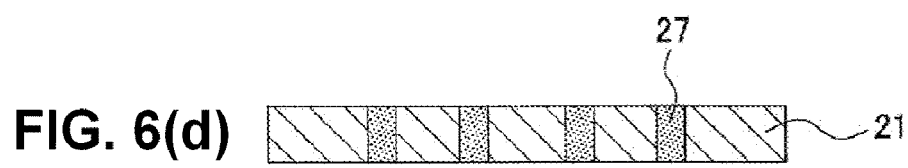

(4) Then, as shown in FIG. 6(d), the via holes 25 are filled with, for example, an Ag-containing paste, to thereby form filled portions 27 (serving as the vias 9).

Figure 6E:
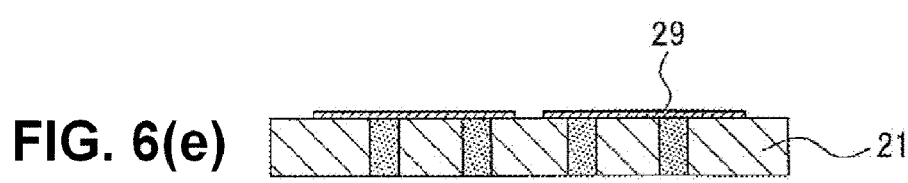

(5) As shown in FIG. 6(e), electrically conductive patterns 29 (serving as the inner wiring layers 7) are formed, through printing, on predetermined portions of the top surface of each of the first green sheets 21 by use of an Ag-containing paste.

Figure 6F:
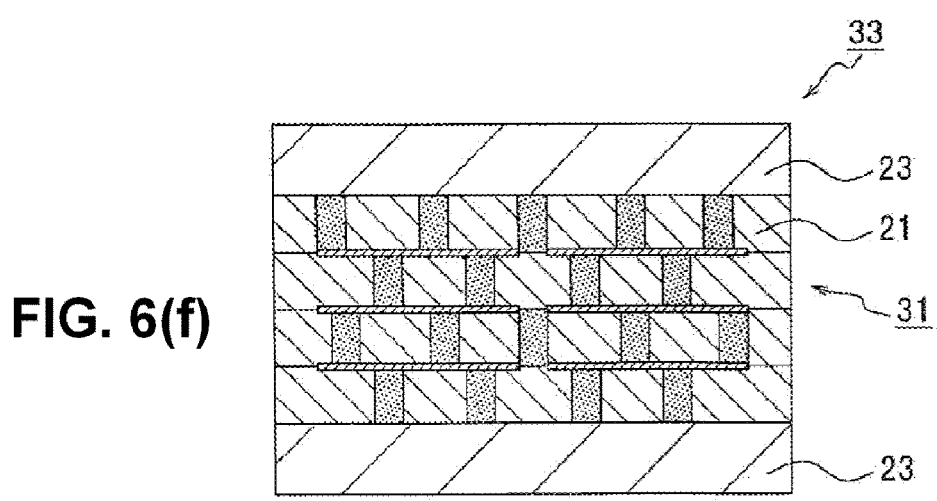

(6) Subsequently, as shown in FIG. 6(f), the above-manufactured first green sheets 21 are sequentially stacked, to thereby form a multi-layer green sheet body 31, and the second green sheets 23 are provided on both surfaces of the multi-layer green sheet body 31, to thereby form a multi-layer green sheet composite 33.

Figure 7A:
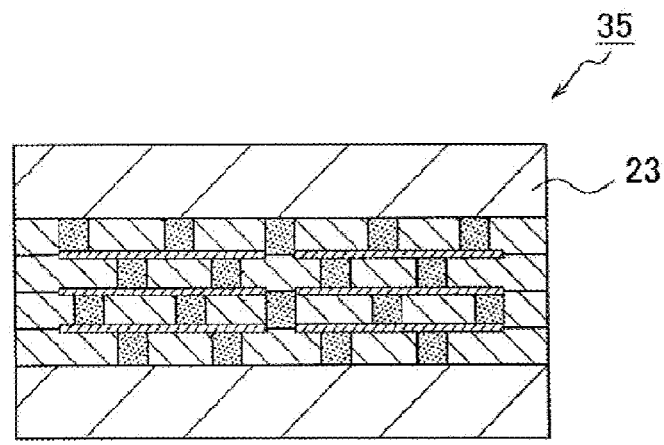
FIG. 7(a) through FIG. 7(d) show the electrical inspection substrate unit at further steps in the exemplary method for manufacturing the exemplary electrical inspection substrate unit.

(7) Then, the multi-layer green sheet composite 33, as shown in FIG. 7(a), is fired (degreased and fired) at 850° C. for 30 minutes while a pressure of 0.2 MPa is applied to both sides (in a lamination direction) of the composite 33 by means of a pressing machine (not illustrated), to thereby yield a sintered multi-layer composite 35.

Figure 7B:
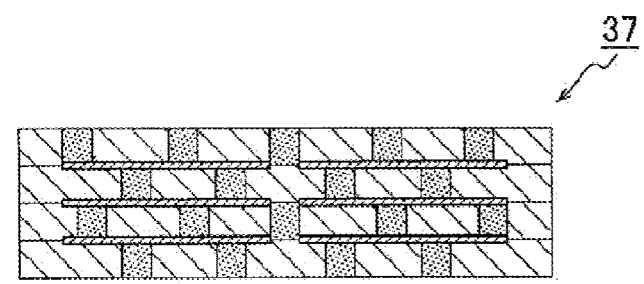

(8) Thereafter, the (unsintered) second green sheets 23 remaining on both main surfaces of the sintered multi-layer composite 35 are removed by means of an ultrasonic cleaner (medium: water), to thereby yield a sintered main body 37, as shown in FIG. 7(b).

Figure 7C:
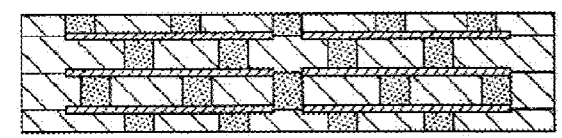

(9) Subsequently, both outer surfaces, as shown in FIG. 7(c), of the sintered main body 37 are lapped by use of alumina abrasive grains.

Figure 7D:
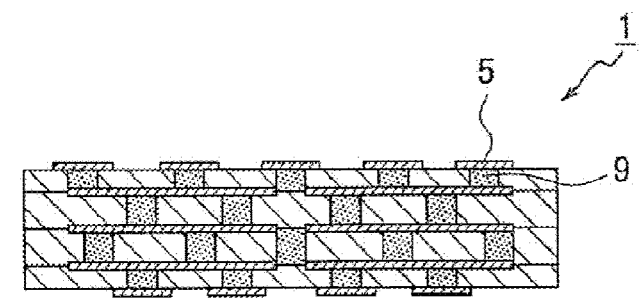

(10) Then, electrodes, as shown in FIG. 7(d), 5 are formed on the surfaces of the thus-lapped sintered main body 37 (i.e., multi-layer ceramic substrate 4) at positions corresponding to the vias 9. The electrodes 5 are formed through, for example, the following procedure: a Ti thin film is formed through sputtering, and then Cu plating, Ni plating, and Au plating are sequentially carried out. Thus, the electrical inspection substrate unit 1 is completed.

c) Since the electrical inspection substrate unit 1 according to this embodiment contains, as main components, mullite of low thermal expansion and the low-temperature-firable borosilicate glass, the electrical inspection substrate unit 1 exhibits low thermal expansion and can be fired at low temperature.

Since the borosilicate glass contains an alkali metal oxide(s) in an amount of 0.5 mass % or more, an increase in viscosity of the glass can be suppressed, and inhibition of densification or elevation of sintering temperature—which would otherwise occur due to reduction in fluidity of the glass upon pressure firing—can be prevented. Since the amount of the alkali metal oxide(s) contained in the borosilicate glass is 1.5 mass % or less, migration of Ag (i.e., inner conductor) can be prevented.

In this embodiment, since the multi-layer ceramic substrate 4 contains mullite (i.e., low-thermal-expansion material) as a filler, the substrate exhibits the mean coefficient of linear thermal expansion having a value of 3.0 to 4.0 ppm/° C. between −50° C. and 150° C. Further, the thermal expansion coefficient α1 of the substrate as determined at a temperature and the thermal expansion coefficient α2 of the to-be-inspected silicon wafer as determined at the same temperature satisfy the following relation: 0 ppm/° C.<α1−α2≦2.5 ppm/° C. through the temperature range of −50° C. to 150° C. Therefore, the electrical inspection substrate unit 1, which includes the multi-layer ceramic substrate, is suitable for use in the IC chip inspection jig 13.

Specifically, the electrical inspection substrate unit 1 shows satisfactory dimensional accuracy, from the viewpoint of electrical connection between the substrate unit and pads 17 of the silicon wafer 15. In addition, even when the temperature of the silicon wafer 15 is changed upon, for example, inspection, the pads 17 of the silicon wafer 15 can be connected to the probes 11 formed on the substrate unit 1 without causing any problem in terms of electrical connection.

In this embodiment, the first green sheets 21 formed of the low-temperature-firable ceramic material containing mullite and the borosilicate glass as main components are fired under application of a pressure of 0.1 MPa to 0.5 MPa. Therefore, even when the multi-layer ceramic substrate 4 has a large thickness (e.g., 3 mm or more), generation of voids or cracks in the substrate 4 is suppressed, and deformation of the substrate 4 is also suppressed. Thus, the electrical inspection substrate unit 1 can be suitably manufactured.

In this embodiment, employment of the low-temperature-firable ceramic material prepared by an appropriate composition realizes formation of the electrical inspection substrate unit 1 exhibiting desired thermal expansion characteristics and mechanical strength and suitable for use in the IC chip inspection jig 13, and therefore realizes manufacture of the IC chip inspection jig 13 exhibiting desired thermal expansion characteristics and mechanical strength.

Test Examples

Next will be described test examples performed for verifying the effects of the present invention.

In Test Examples, materials shown in Tables 1 and 2 were employed, and evaluations were carried out, under the below-described conditions, in terms of mean coefficient of linear thermal expansion, (α1−α2) at −50° C., 30° C., and 150° C., relative density, flexural strength, dimensional variation, alignment with testing pad, insulation resistance (migration property), appearance, via curvature degree, conduction, and generation of voids around vias. The results are shown in Tables 3 to 6.

Glasses A to H shown in Table 2 correspond to borosilicate glasses.

a) Thermal Expansion Coefficient

Multi-layer ceramic substrate samples (20 mm (length)×4 mm (width)×3 mm (thickness)) were prepared from materials shown in Tables 1 and 2 through a manufacturing method similar to that described above in the embodiment.

The rate of change in size of each sample was measured at −60° C. to 200° C. by means of a thermomechanical analyzer (TMA), and data on expansion upon measurement and measurement temperature were sampled. Specifically, sampling was carried out every 1.0 second; a graph was prepared by use of the thus-obtained data (vertical axis: expansion, horizontal axis: measurement temperature); and the thermal expansion coefficient of the sample was determined on the basis of gradients before and after sampling. The mean coefficient of linear thermal expansion of the sample was determined on the basis of gradients of the graph at between −50° C. and 150° C. The results are shown in Table 3.

b) Difference in Instantaneous Coefficient of Linear Thermal Expansion (α1−α2) at −50° C., 30° C., and 150° C.

The thermal expansion coefficient (α1) of each of the above-prepared multi-layer ceramic substrates was determined at −50° C., 30° C., and 150° C., and the thermal expansion coefficient (α2) of a portion of a silicon wafer rod was determined at −50° C., 30° C., and 150° C. in a manner similar to that described above, followed by calculation of α1−α2. The results are shown in Table 3.

A sample (20 mm (length)×4.5 mm (width)×4.5 mm (thickness)) was employed as a portion of a silicon wafer rod.

c) Relative Density (Sintering Performance after Firing)

Multi-layer ceramic substrate samples (20 mm (length)×20 mm (width)×5 mm (thickness)) were prepared from materials shown in Tables 1 and 2 through a manufacturing method similar to that described above in the embodiment.

The specific gravity of each sample was measured after firing through the Archimedes method, and the relative density of the sample was calculated on the basis of the theoretical specific gravity thereof. The results are shown in Table 3.

d) Flexural Strength

Multi-layer ceramic substrate samples (50 mm (length)×4 mm (width)×3 mm (thickness)) were prepared from materials shown in Tables 1 and 2 through a manufacturing method similar to that described above in the embodiment.

The flexural strength of each sample was determined through the three-point bending test according to JIS R1601. The results are shown in Table 3.

e) Crystalline Phase

Multi-layer ceramic substrate samples (20 mm (length)×20 mm (width)×5 mm (thickness)) were prepared from materials shown in Tables 1 and 2 through a manufacturing method similar to that described above in the embodiment.

Each of the samples which had been prepared through firing was ground into powder, and the crystalline phase of the sample was determined through powder X-ray diffractometry. The results are shown in Table 1.

f) Dimensional Variation

Multi-layer green sheet product samples (100 mm (length)×100 mm (width)×7.5 mm (thickness)) were prepared from materials shown in Tables 1 and 2 through a manufacturing method similar to that described above in the embodiment.

Patterns ($\phi$ 0.5 mm) were formed, through printing, at corners of a square portion (90 mm×90 mm) on a surface of each sample. In a manner similar to that described above in the embodiment, the sample having the patterns thereon was sandwiched between restraint sheets and fired under application of pressure. Thus, 20 fired samples were prepared. The dimensional variation (3σ) of the 20 samples was determined. The results are shown in Table 3.

g) Alignment with Inspection Pad

Figure 8:
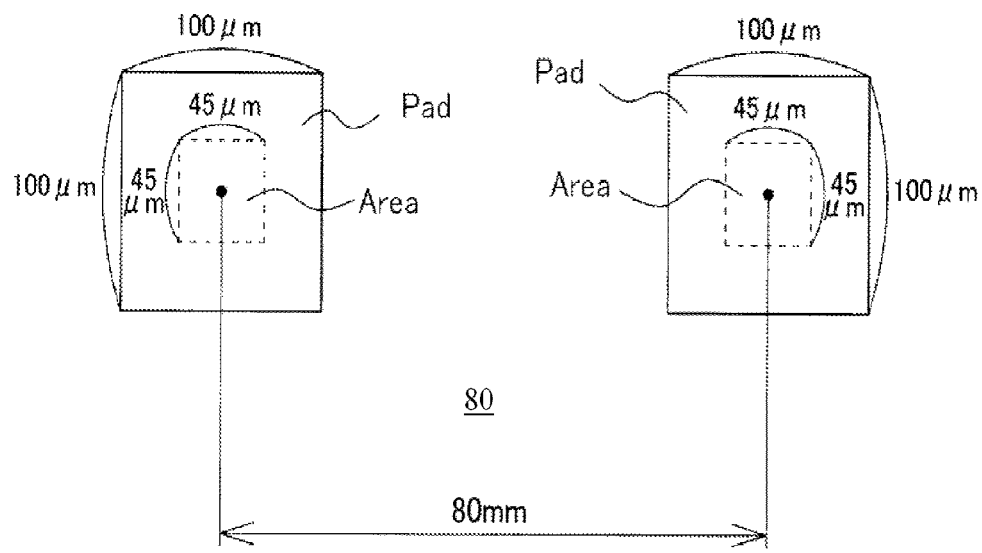
FIG. 8 is a plan view of a test substrate including right and left pads having a test area at a center of each pad.

As shown in FIG. 8, a test substrate 80 was prepared by forming a pair of right and left pads (100 μm×100 μm) on a silicon wafer so that the distance between the centers of the pads was 80 mm. A testing area (45 μm×45 μm) was provided at the center of each pad.

Multi-layer ceramic substrate samples (100 mm (length)×100 mm (width)×5 mm (thickness)) were prepared from materials shown in Tables 1 and 2 through a manufacturing method similar to that described above in the embodiment. A pair of right and left terminals (probes) for connection testing was formed on each sample at positions corresponding to the centers of the testing areas of the test substrate.

Connection testing was carried out by bringing the paired terminals of the sample into contact with the test substrate at −50° C., 30° C., and 150° C. Specifically, when the contact traces of the right and left terminals were left within the right and left testing areas at all these temperatures, "OK" was assigned, whereas when the contact trace of any of the terminals was left outside the corresponding testing area at any of these temperatures, "NG" was assigned. The results are shown in Table 3.

h) Insulation Resistance

Multi-layer ceramic substrate samples (50 mm (length)×50 mm (width)×5 mm (thickness)) were prepared from materials shown in Tables 1 and 2 through a manufacturing method similar to that described above in the embodiment.

A pair of Ag wiring layers (30 mm (length)×30 mm (width)×10 μm (thickness)) was provided in each sample in a thickness direction so that the insulation distance between the wiring layers was 0.1 mm. Insulation resistance was measured under application of a voltage of 100 V between the Ag wiring layers, to thereby evaluate migration property. The results are shown in Tables 4 and 5.

i) Dimensional Variation and Appearance

The procedure of the aforementioned embodiment was repeated, except that materials shown in Tables 1 and 2 were employed, and pressurization conditions were changed, to thereby prepare multi-layer green sheet units (100 mm (length)×100 mm (width)×5 mm (thickness)) (20 products for each Test Example), followed by firing. The thus-fired 20 samples were evaluated in terms of appearance and dimensional variation (3σ) (i.e., variation in distance between patterns ($\phi$ 0.5 mm) formed, through printing, at corners of a square portion (90 mm×90 mm) on a surface of each sample). The results are shown in Table 6.

j) Via Curvature Degree

Multi-layer ceramic substrate samples (200 mm (length)×200 mm (width)×5 mm (thickness)) were prepared from materials shown in Tables 1 and 2 through a manufacturing method similar to that described above in the embodiment.

Figure 9:
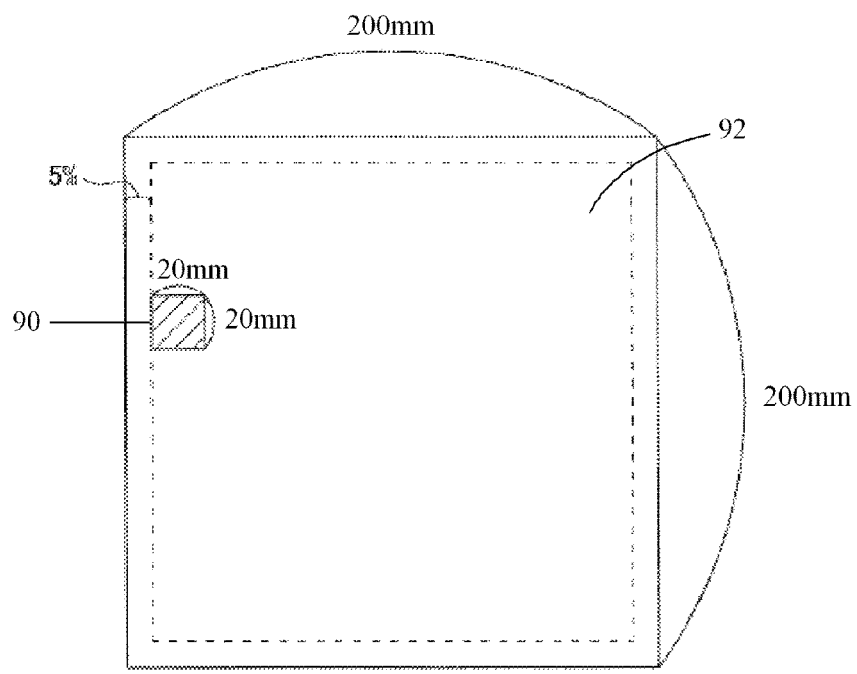
FIG. 9 is a plan view of a multi-layer ceramic substrate sample including a test piece used for determination of a degree of curvature of vias (i.e., "via curvature degree").

As shown in FIG. 9, a test piece 90 (20 mm×20 mm) was cut out of each sample 92 at a position located inward (in a plane direction) from the outermost periphery of the sample by a distance of 5% or less of the substrate length. The cut surfaces of the test piece were ground, to thereby expose vias in a cross-sectional direction.

Thereafter, as shown in FIG. 10, a straight line (X) was formed by connecting the upper end (A) (on the substrate peripheral side) of an exposed via and the lower end (B) (on the substrate peripheral side) of the via, and the distance (ΔS) between the straight line (X) and a straight line (Y) passing through a point of the via (on the substrate peripheral side), the point being located most distal to the straight line (X), was regarded as "via curvature degree." Via curvature degree was determined at 10 points, and the thus-obtained data were averaged. The results are shown in Table 6.

k) Conduction Testing

Multi-layer ceramic substrate samples (100 mm (length)×100 mm (width)×5 mm (thickness)) were prepared from materials shown in Tables 1 and 2 through a manufacturing method similar to that described above in the embodiment (20 samples for each lot).

For conduction testing, conduction between two or more connected vias or wiring conductors was tested, to thereby determine the presence or absence of disconnection. In this conduction testing (determination of the presence or absence of poor conduction due to, for example, disconnection), a four-terminal resistance meter (Milliohm Tester, product of Hioki E. E. Corporation) was employed as a conduction testing apparatus, and all the samples of one lot were subjected to conduction testing. When at least one sample of one lot shows no conduction, or shows conduction but exhibits a resistance of 5Ω or higher, the lot was evaluated as "not passed." The results are shown in Table 6.

l) Generation of Voids Around Vias

The aforementioned samples employed for determination of via curvature degree were observed under an optical microscope (×150), to thereby determine whether or not voids were generated around via conductors. The results are shown in Table 6.

TABLE 1

| | Filler species | Filler [vol. %] | Glass composition | Crystalline phase |
|---|---|---|---|---|
| Test Example 1 | Mullite | 40 | A | Mullite |
| Test Example 2 | Mullite | 25 | A | Mullite |
| Test Example 3 | Mullite | 20 | A | Mullite |
| Test Example 4 | Mullite | 15 | A | Mullite |
| Test Example 5 | Mullite | 45 | A | Mullite |
| Test Example 6 | Cordierite | 40 | A | Cordierite, cristobalite |
| Test Example 7 | Mullite | 40 | B | Mullite |
| Test Example 8 | Silicon nitride | 40 | A | Silicon nitride |
| Test Example 9 | Aluminum nitride | 40 | A | Aluminum nitride |
| Test Example 10 | Mullite | 40 | E | Mullite |
| Test Example 11 | Mullite | 40 | F | Mullite |
| Test Example 12 | Mullite | 40 | G | Mullite |
| Comparative Example 1 | Quartz glass | 40 | A | — |
| Comparative Example 2 | Alumina | 40 | A | Alumina |

TABLE 2

| Glass composition [mass %] | $SiO_2$ | $B_2O_3$ | $Al_2O_3$ | ZnO | PbO | BaO | SrO | CaO | $Na_2O$ | $K_2O$ | $Li_2O$ |
|---|---|---|---|---|---|---|---|---|---|---|---|
| A | 48 | 18 | 10 | 7 | 0 | 0 | 0 | 16 | 0.5 | 0.5 | 0 |
| B | 43 | 15 | 15 | 9 | 0 | 0 | 0 | 18 | 0 | 0 | 0 |
| C | 48 | 18 | 10 | 7 | 0 | 0 | 0 | 16 | 0 | 0 | 1.0 |
| D | 48 | 18 | 10 | 7 | 0 | 0 | 0 | 15 | 1.0 | 1.0 | 0 |
| E | 60 | 14.4 | 5 | 0 | 0 | 5 | 0 | 15 | 0.3 | 0.3 | 0 |
| F | 50 | 3 | 7 | 0 | 30 | 0 | 0 | 5 | 1.0 | 0.5 | 0 |
| G | 65 | 17 | 5 | 4 | 0 | 0 | 4 | 4 | 0 | 1.0 | 0 |
| H | 50 | 15 | 10 | 7 | 0 | 0 | 0 | 17 | 0.5 | 0.4 | 0.1 |

TABLE 3

Test Examples of the Invention and Comparative Examples

| | Means coefficient of thermal expansion [ppm/°C] | α1−α2 (−50° C.) | α1−α2 (30° C.) | α1−α2 (150° C.) | Relative density [%] | Flexural strength [MPa] | Dimensional variation [%] | Alignment with testing pad |
|---|---|---|---|---|---|---|---|---|
| Test Example 1 | 3.7 | 0.8 | 1.3 | 2.1 | 98 | 220 | ±0.08 | OK |
| Test Example 2 | 3.8 | 0.5 | 1.1 | 1.7 | 99 | 200 | ±0.05 | OK |
| Test Example 3 | 3.9 | 0.7 | 1.3 | 1.9 | 99 | 200 | ±0.08 | OK |
| Test Example 4 | 4.0 | 0.7 | 1.4 | 2.0 | 99 | 180 | ±0.10 | OK |
| Test Example 5 | 3.4 | 1.0 | 1.8 | 2.5 | 98 | 250 | ±0.08 | OK |
| Test Example 6 | 3.1 | 0.2 | 0.4 | 0.7 | 96 | 160 | ±0.15 | OK |
| Test Example 7 | 3.6 | 0.7 | 1.4 | 2.0 | 88 | 120 | ±0.17 | OK |
| Test Example 8 | 3.1 | 0.2 | 0.6 | 1.1 | 95 | 220 | ±0.20 | OK |
| Test Example 9 | 3.7 | 0.6 | 1.4 | 2.2 | 95 | 210 | ±0.18 | OK |
| Test Example 10 | 3.5 | 0.8 | 1.6 | 2.2 | 95 | 250 | ±0.09 | OK |
| Test Example 11 | 3.9 | 1.2 | 1.7 | 2.3 | 98 | 250 | ±0.05 | OK |
| Test Example 12 | 3.7 | 1.0 | 1.4 | 2.2 | 95 | 250 | ±0.08 | OK |
| Comparative Example 1 | 3.0 | −0.2 | 0.1 | 0.5 | 99 | 85 | ±0.08 | NG |
| Comparative Example 2 | 4.8 | 1.6 | 1.9 | 2.6 | 95 | 290 | ±0.05 | NG |

As is clear from Table 3, in Test Examples 1 to 10 of the invention according to claim 1, the multi-layer ceramic substrate exhibits a mean coefficient of linear thermal expansion of 3.0 to 4.0 ppm/° C. between −50° C. and 150° C. Further, the thermal expansion coefficient α1 of the substrate as determined at a temperature and the thermal expansion coefficient α2 of the silicon wafer as determined at the same temperature satisfy the following relation: 0 ppm/° C.<α1−α2 ≦2.5 ppm/° C. through a range of −50° C. to 150° C. Therefore, the multi-layer ceramic substrate shows good alignment with an inspection pad, which is preferred.

In contrast, in Comparative Examples 1 and 2, the multi-layer ceramic substrate does not satisfy the requirements of the invention according to claim 1, and thus the substrate shows poor alignment with an inspection pad, which is not preferred.

TABLE 4

Test Examples of the Invention and Comparative Example

| | Filler species | Filler [vol. %] | Glass composition | Insulation resistance [Ω] |
|---|---|---|---|---|
| Test Example 1 | Mullite | 40 | A | >1 × 10$^{10}$ |
| Test Example 13 | Mullite | 40 | E | >1 × 10$^{10}$ |
| Test Example 14 | Mullite | 40 | F | >1 × 10$^{10}$ |
| Comparative Example 3 | Mullite | 40 | D | 8 × 10$^{8}$ |

As is clear from Table 4, in Test Examples 1, 13, and 14 of the invention according to claim 2, the multi-layer ceramic substrate contains alkali metal oxides in an appropriate amount (0.6 to 1.5 vol. %), and thus the substrate exhibits high insulation resistance (i.e., migration is less likely to occur), which is preferred. In contrast, in Comparative Example 3, the multi-layer ceramic substrate contains alkali metal oxides in a large amount (2 vol. %), and thus the substrate exhibits low insulation resistance, which is not preferred.

TABLE 5

Test Examples of the Invention and Comparative Example

| | Filler species | Filler [vol. %] | Glass composition | Insulation resistance [Ω] |
|---|---|---|---|---|
| Test Example 1 | Mullite | 40 | A | >1 × 10$^{10}$ |
| Test Example 15 | Mullite | 40 | H | >1 × 10$^{10}$ |
| Comparative Example 4 | Mullite | 45 | C | 8 × 10$^{7}$ |

As is clear from Table 5, in Test Examples 1 and 15 of the invention, the multi-layer ceramic substrate contains alkali metal oxides in an appropriate amount (1 to 1.1 vol. %) and Li$_2$O in an appropriate amount (0.1 vol. % or less), and thus the substrate exhibits high insulation resistance (i.e., migration is less likely to occur), which is preferred. In contrast, in Comparative Example 4, the multi-layer ceramic substrate contains Li$_2$O in a large amount (1 vol. %), and thus the substrate exhibits low insulation resistance, which is not preferred.

TABLE 6

Test Examples of the Invention and Comparative Examples

| | Filler species | Filler [vol. %] | Glass composition | Applied Pressure [MPa] | Dimensional variation [%] | Appearance | Via curvature degree [μm] | Conduction testing | Generation of Voids around vias |
|---|---|---|---|---|---|---|---|---|---|
| Test Example 16 | Mullite | 40 | A | 0.10 | ±0.10 | No problem | 10 | Passed | Not generated |
| Test Example 17 | Mullite | 40 | A | 0.20 | ±0.08 | No problem | 30 | Passed | Not generated |
| Test Example 18 | Mullite | 40 | A | 0.50 | ±0.08 | No problem | 100 | Passed | Not generated |
| Comparative Example 5 | Mullite | 40 | A | 0.08 | ±0.15 | Generation of Cracks | 50 | Passed | Generated |
| Comparative Example 6 | Mullite | 40 | A | 0.55 | ±0.08 | Deformation of side surfaces | 150 | Not passed | Not generated |

As is clear from Table 6, in Test Examples 16 to 18, since the applied pressure fell within an appropriate range (0.1 to 0.5 MPa), as shown in FIG. 11(a) and FIGS. 12(b) to 12(d), deformation of the electrical inspection substrate unit 1 was suppressed, and curvature of vias 9 in the interior of the substrate unit was also suppressed.

In contrast, in Comparative Example 5, since the applied pressure was low, as shown in FIG. 11(b) and FIG. 12(a), a center portion 110 of the electrical inspection substrate unit 1 was deformed, and surfaces which were in contact with the restraint layers 112, 114 shrank. Thus, a considerable dimensional variation was observed, and cracks were generated. In addition, deformation of the electrical inspection substrate unit 1 caused inward curvature of vias 9 in the interior of the substrate unit, resulting in generation of voids 120 at side surfaces of vias 9 on the substrate peripheral side.

In Comparative Example 6, since the applied pressure was high, as shown in FIG. 11(c) and FIG. 12(e), a center portion of the electrical inspection substrate unit 1 was deformed (and thus side surfaces of the substrate unit were deformed), the thickness of the substrate unit was reduced, and vias 9 in the interior of the substrate unit were considerably curved outward. As shown in FIG. 13(a) and FIG. 13(b), this curvature caused deformation of connecting vias 9 and an inner wiring layer 130, resulting in, for example, poor conduction in the substrate unit due to disconnection.

Needless to say, the present invention is not limited to the aforementioned embodiment, and various embodiments may be made without departing from the scope of the present invention.

DESCRIPTION OF REFERENCE NUMERALS

| | |
|---|---|
| 1. | Electrical inspection substrate unit |
| 3. | Glass ceramic layer |
| 4. | Multi-layer ceramic substrate |
| 5. | Electrode |
| 7. | Inner wiring layer |
| 9. | Via |
| 13. | IC chip inspection jig (silicon wafer electrical inspection jig) |
| 15. | Silicon wafer |
| 21. | First green sheet |
| 23. | Second green sheet (restraint sheet) |
| 31. | Multi-layer green sheet body |
| 33. | Multi-layer green sheet composite |
| 35. | Sintered multi-layer body |
| 37. | Sintered main body |
| 80. | Test substrate |
| 90. | Test piece cut from multi-layer ceramic substrate sample |
| 92. | Multi-layer ceramic substrate sample |
| 110. | Center portion of electrical inspection substrate unit |
| 120. | Void |

What is claimed is:

1. An electrical inspection substrate unit comprising:
a multi-layer ceramic substrate; and
electrodes formed on a surface of the multi-layer ceramic substrate, each electrode including at least one of a Ti or a Cr layer formed by sputtering, each electrode for electrical communication with a respective electrically conductive probe to thereby form an IC chip inspection jig;
the multi-layer ceramic substrate having a mean coefficient of linear thermal expansion having a value of 3.0 to 4.0 ppm/° C. between −50° C. and 150° C.; and
a thermal expansion coefficient, $\alpha 1$, of the multi-layer ceramic substrate as determined at a particular temperature and a thermal expansion coefficient, $\alpha 2$, of a to-be-inspected silicon wafer as determined at the same temperature satisfying a relation: 0 ppm/° C. $<\alpha 1 - \alpha 2 \leqq 2.5$ ppm/° C. through the temperature of −50° C. to 150° C.

2. The electrical inspection substrate unit of claim 1, wherein the multi-layer ceramic substrate comprises ceramic layers comprising mullite and a borosilicate glass, the borosilicate glass comprising an alkali metal oxide in an amount of 0.5 to 1.5 mass %, and wherein an inner conductor of the multi-layer ceramic substrate is formed of any one of Ag, an Ag/Pt alloy, and an Ag/Pd alloy.

3. The electrical inspection substrate unit of claim 2, wherein the borosilicate glass comprises $Li_2O$ in an amount of 0.1 mass % or less.

4. The electrical inspection substrate unit of claim 3, wherein an amount of mullite is 20 to 45 vol. % of the multi-layer ceramic substrate.

5. The electrical inspection substrate unit of claim 2, wherein an amount of mullite is 20 to 45 vol. % of the multi-layer ceramic substrate.

6. A method for manufacturing an electrical inspection substrate unit, comprising:
forming a predetermined number of first green sheets from a low-temperature-finable ceramic material containing, as principal components, mullite and a borosilicate glass;
forming a conductor on each of the first green sheets;
stacking the first green sheets to form a multi-layer green sheet unit having a top surface and a bottom surface;
stacking a second green sheet on each of the top surface and the bottom surface of the multi-layer green sheet unit to form a multi-layer green sheet composite, the second green sheets comprising a material which does not sinter at a temperature at which the first green sheets are fired;
firing the multi-layer green sheet composite under application of pressure;
removing unsintered layers formed of the second green sheets from the multi-layer green sheet composite, to thereby form a multi-layer ceramic substrate; and
forming an electrode on a surface of the multi-layer ceramic substrate through Ti sputtering, Cu plating, Ni plating, and Au plating, the electrode for electrical communication with an electrically conductive probe to form an electrical inspection substrate unit.

7. The method for manufacturing an electrical inspection substrate unit of claim 6, wherein the pressure applied during firing is 0.1 to 0.5 MPa.

8. An electrical inspection substrate unit comprising:
a multi-layer ceramic substrate; and
electrodes formed on a surface of the multi-layer ceramic substrate, each electrode including at least one of a Ti or a Cr layer, each electrode for electrical communication with a respective electrically conductive probe to thereby form an IC chip inspection jig;
the multi-layer ceramic substrate having a mean coefficient of linear thermal expansion having a value of 3.0 to 4.0 ppm/° C. between −50° C. and 150° C.; and
a thermal expansion coefficient, $\alpha 1$, of the multi-layer ceramic substrate as determined at a particular temperature and a thermal expansion coefficient, $\alpha 2$, of a to-be-inspected silicon wafer as determined at the same temperature satisfying a relation: 0 ppm/° C. $<\alpha 1 - \alpha 2 \leqq 2.5$ ppm/° C. through the temperature of −50° C. to 150° C.;
wherein the multi-layer ceramic substrate comprises ceramic layers consisting only of mullite and a borosilicate glass.

9. The electrical inspection substrate unit of claim 8, wherein an amount of mullite is 20 to 45 vol. % of the multi-layer ceramic substrate.

10. An electrical inspection substrate unit comprising:
a multi-layer ceramic substrate; and
electrodes formed on a surface of the multi-layer ceramic substrate, each electrode including at least one of a Ti or a Cr layer, each electrode for electrical communication with a respective electrically conductive probe to thereby form an IC chip inspection jig;
the multi-layer ceramic substrate having a mean coefficient of linear thermal expansion having a value of 3.0 to 4.0 ppm/° C. between −50° C. and 150° C.; and
a thermal expansion coefficient, $\alpha 1$, of the multi-layer ceramic substrate as determined at a particular temperature and a thermal expansion coefficient, $\alpha 2$, of a to-be-inspected silicon wafer as determined at the same temperature satisfying a relation: 0 ppm/° C. $<\alpha 1-\alpha 2 \leq 2.5$ ppm/° C. through the temperature of −50° C. to 150° C.;
wherein the multi-layer ceramic substrate comprises ceramic layers comprising mullite and a borosilicate glass, the borosilicate glass comprising an alkali metal oxide in an amount of 0.5 to 1.5 mass %; and
wherein an amount of mullite is 20 to 45 vol. % of the multi-layer ceramic substrate.

* * * * *